(12) United States Patent
Leedom

(10) Patent No.: US 6,865,279 B2
(45) Date of Patent: Mar. 8, 2005

(54) HEARING AID WITH A FLEXIBLE SHELL

(75) Inventor: Marvin A. Leedom, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 326 days.

(21) Appl. No.: 09/804,983

(22) Filed: Mar. 13, 2001

(65) Prior Publication Data

US 2001/0043707 A1 Nov. 22, 2001

Related U.S. Application Data

(60) Provisional application No. 60/188,997, filed on Mar. 13, 2000.

(51) Int. Cl.$^7$ ............................................... H04R 25/00
(52) U.S. Cl. ......................... 381/322; 381/323; 381/325
(58) Field of Search ................................ 381/322, 323, 381/324, 325, 328, 380, 189; 181/130, 135

(56) References Cited

U.S. PATENT DOCUMENTS

| 4,440,982 A | * | 4/1984 | Kaanders et al. | |
|---|---|---|---|---|
| 5,002,151 A | * | 3/1991 | Oliveira et al. | |
| 5,825,896 A | | 10/1998 | Leedom | ........................ 381/69 |
| 5,881,158 A | | 3/1999 | Lesinski et al. | ............. 381/174 |
| 5,970,157 A | * | 10/1999 | Yoest | .......................... 381/325 |
| 6,097,825 A | * | 8/2000 | Yoest et al. | .................. 381/322 |
| 6,129,174 A | * | 10/2000 | Brown et al. | |
| 6,208,741 B1 | * | 3/2001 | Shennib et al. | ............. 381/323 |
| 6,456,720 B1 | * | 9/2002 | Brimhall et al. | |
| 6,473,513 B1 | | 10/2002 | Shennib et al. | |

FOREIGN PATENT DOCUMENTS

DE    G 87 12 957.4    1/1989    ........... H04R/25/02

* cited by examiner

Primary Examiner—Suhan Ni
(74) Attorney, Agent, or Firm—Hamilton, Brook, Smith & Reynolds, P.C.

(57) ABSTRACT

A hearing aid assembled from three sections includes a first section having a first housing containing a microphone and electronics, a second section having a second housing containing a battery a flex circuit mounted around the battery and a third section having a compliant tip and a receiver contained within a receptacle in the tip. The flex circuit provides solder less electrical connections among the electrical components of the hearing aid. The hearing aid also includes an actuator switch that allows the user to engage the hearing aid in an ON or an OFF mode of operation. Preferably, the actuator is electrically connected to the hearing aid without the use of solder. Connection between the first and second sections includes a mechanical securing mechanism, such as an interlocking joint.

42 Claims, 13 Drawing Sheets

HEARING AID WITH A FLEXIBLE SHELL

RELATED APPLICATIONS

This application claims the benefit of U.S. Provisional Application No. 60/188,997, filed on Mar. 13, 2000. The entire teachings of the above application is incorporated herein by reference.

This application is related to copending U.S. applications:

| ATTORNEY DOCKET NO. | APPLICATION NO. | TITLE |
| --- | --- | --- |
| SMI-13459pA | 09/524,666 | Disposable Modular Hearing Aid |
| 2506.1005-001 | 09/524,043 | Mass Produced Hearing Aid With a Limited Set of Acoustical Formats |
| 2506.1013-001 | 09/524,040 | One-Size-Fits-All Uni-Ear Hearing Instrument |
| 2506.2008-001 | 09/524,501 | Hearing Aid |
| 2506.2013-000 | 60/188,996 | Hearing Aid Prescription Selector |
| 2506.2014-000 | 60/188,721 | Through-Hole and Surface Mount Technologies for Highly-Automatable Hearing Aid Receivers |
| 2506.2019-000 | 60/188,857 | Remote Programming and Control Means for a Hearing Aid | all filed Mar. 13, 2000, the entire teachings of which are incorporated herein by reference.

BACKGROUND OF THE INVENTION

Modern hearing aids comprise an ear mold having therein the necessary electronics for amplifying and otherwise conditioning sound to compensate for a user's hearing loss. Such electronics generally include a microphone for receiving the sound and converting the sound to an electrical signal, an electronic circuit for amplifying and processing the signal produced by the microphone, a speaker, also known as a receiver, for converting the processed signals into sound energy and a battery for providing operational power to the hearing aid. The ear mold can be generally made of plastic, and is specially designed and molded to fill the ear of the person who is to use the hearing aid. Generally, the ear mold is made of a hard plastic so as to have a long life and so that it can be periodically cleaned. The electronics of the signal processing circuitry are typically adjusted to meet its users specific hearing requirements. These requirements are obtained by first testing the user's hearing and then designing a circuit having a frequency response characteristic that compensates for any hearing loss discovered in the test. After the desired circuit is determined from the tests, it may be finally adjusted by a hearing aid specialist to meet the final requirements of the party. All of the above features including the structure, the method of making and the method of adjusting the hearing aid can make the hearing aid relatively expensive.

Conventionally, hearing aids have a battery that must be replaced periodically as the battery size is small and provides a limited lifetime of operation. Hearing aid users frequently complain about the difficulty in replacing batteries. Having a hearing aid that does not require battery replacement, or replacement at fewer time intervals, would be advantageous to these users.

Presently, the process of manufacturing hearing aids is time consuming and adds to the expense of the hearing aids. For example, assemblers place the hearing aid components within a shell and solder the components together. The shell is then typically solvent sealed to secure the components within the hearing aid. During the sealing process, the assembler holds the two shell portions together after applying the solvent to ensure proper adhesion of the shell. These steps lengthen the process of forming a hearing aid.

SUMMARY OF THE INVENTION

An embodiment of the present invention relates to a hearing aid and a method of manufacturing the hearing aid. A hearing aid includes a first section, a second section and a third section. The first section contains a microphone and electronics. The second section is attached to the first section and includes a battery having a flex circuit mounted around the battery. The third section is attached to the second section and includes a compliant tip and a receiver. The receiver is contained within a receptacle in the tip. The flex circuit electrically connects the microphone, electronics, receiver and battery.

The first section can have a first housing to hold the microphone and electronics. The second section can include a second housing to hold the battery and flex circuit.

The flex circuit can have a receiver mating portion and a microphone mating portion where the receiver mating portion abuts the receiver and the microphone mating portion abuts the microphone. The flex circuit can also include compliant electrical connectors for connecting the microphone, electronics, receiver and battery where the compliant electric connectors provide strain relief for the flex circuit. These compliant electrical connectors can include at least one receiver connector, at least one cathode connector or at least one anode connector. The flex circuit can also include at least one aperture to allow air to travel to the battery.

The flex circuit can have a microphone mating portion that abuts the microphone and forms an electric connection between the flex circuit and the microphone. Also, the flex circuit can include a receiver mating portion that abuts the receiver and forms an electric connection between the flex circuit and the receiver. Preferably, the electric connections formed between the flex circuit and the microphone and between the flex circuit and the receiver are not soldered.

The flex circuit can have a plurality of conductive paths including at least one receiver lead and at least one anode lead. The anode lead can have a discontinuity that prevents the hearing aid from drawing power from the battery. The hearing can include an actuator mounted to the hearing aid where the actuator has a conductive surface contacting the anode such that the conductive surface bridges the discontinuity in the anode to engage the hearing aid in an ON mode of operation. Preferably, the contact between the actuator and the anode is not soldered.

The hearing aid can also include a mechanical securing mechanism between the first section and the second section. Preferably, the securing mechanism is an interlocking joint. The second section can include a potting material surrounding the receiver such that the potting material and the receptacle of the tip encapsulate the receiver to attenuate acoustic feedback.

The tip can include a channel to aid in removal of wax from a bore in the tip. The tip includes a mushroom shaped portion and a sound bore attached to the mushroom shaped portion. The tip can include a first durometer material and a second durometer material, the first durometer material being relatively more compliant than the second durometer material. Preferably, the first durometer material forms the mushroom shaped portion of the tip and the second durometer material forms the sound bore of the tip.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
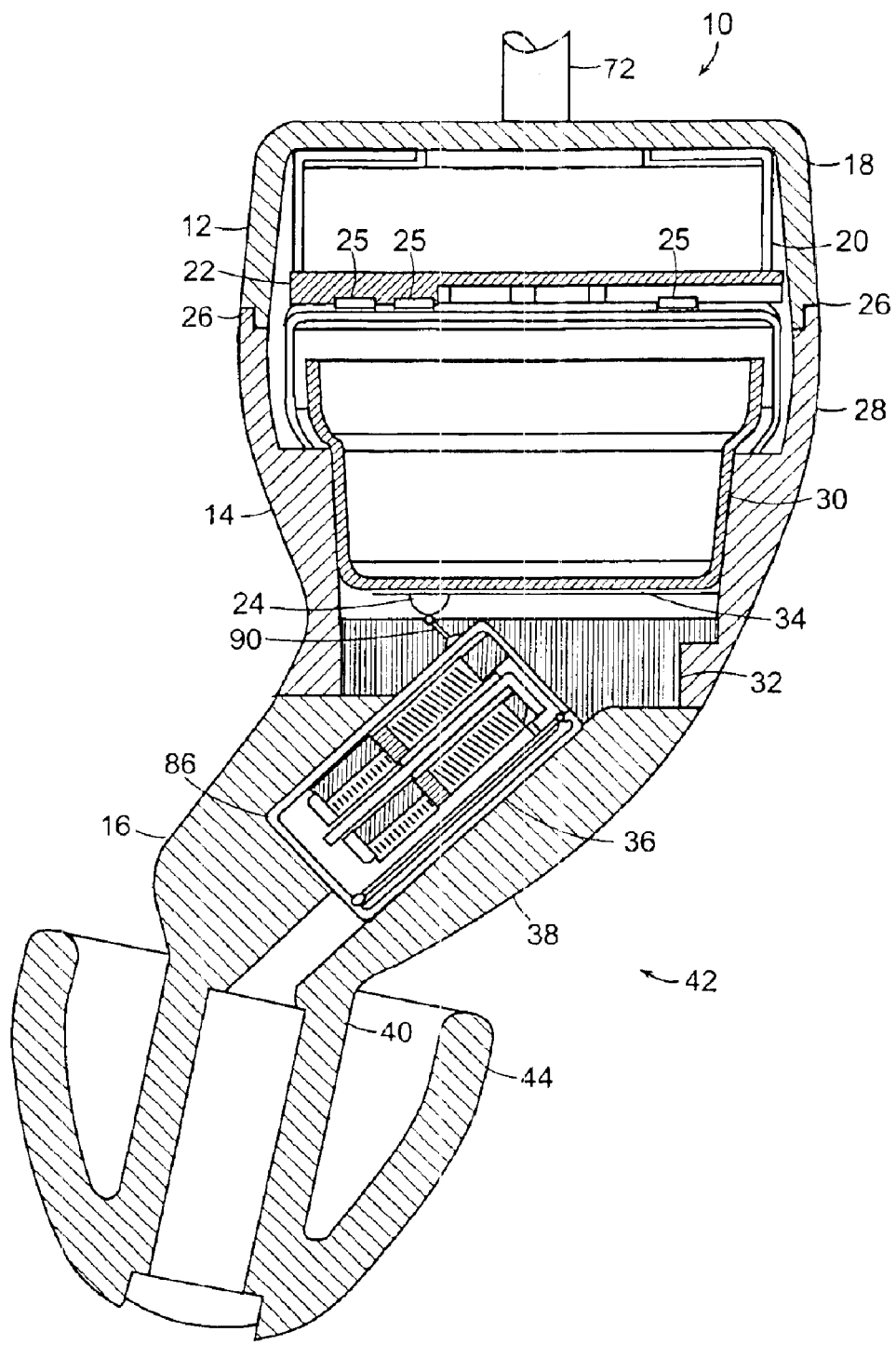
FIG. 1 illustrates a hearing aid.

A hearing aid is shown in FIG. 1 and is given generally as 10. The hearing aid includes a first section 12, a second section 14 and a third section 16.

The first section 12 includes a cup or first section housing 18, a microphone 20, and electronics such as a microphone circuit board 22. The cup 18 can be a shell formed from a plastic material. The microphone 20 is secured within the cup 18 with a securing mechanism between the microphone 20 and cup 18. The securing mechanism can include a snap fit or a friction fit between the microphone 20 and cup 18. The microphone 20 and cup 18 can be provided as a complete subassembly. The microphone circuit board 22 includes a plurality of conductive protrusions 25 which interface electronically with the second section 14 of the hearing aid 10 and provide for an electrical connection between the microphone 20 and the second section 14. Preferably, the circuit board 22 includes three conductive protrusions 25. The conductive protrusions 25 can be made from a compliant material or formed into a compliant structure, such as small leaf springs, for example.

The first section 12 and the second section 14 include a mechanical securing mechanism 26 such as an interlocking joint, for example. The securing mechanism 26 can include mating portions which form an interlocking joint along the outer edge of the cup 18 to attach the first section 12 to the second section 14. Because the securing mechanism 26 creates an attachment between the first 12 and second 14 sections, the interface between the sections 12, 14 does not require any additional solvent seal as a secondary or back-up seal.

The second section 14, illustrated in FIG. 1, includes a shell or second section housing 28, a battery 30, a potting material 32 and kapton tape or a flex circuit 34 surrounding the battery 30. The flex circuit 34 includes an adhesive which allows the flex circuit 34 to be secured to the battery 30. The adhesive can be located on a side of the flex circuit 34 not having electrical connector components or mating portions. The shell 28 connects to the cup 18 of the first section 12. The potting material 32 adds mass to the hearing aid 10 and attenuates feedback-inducing vibrations in the hearing aid 10.

Figure 2:
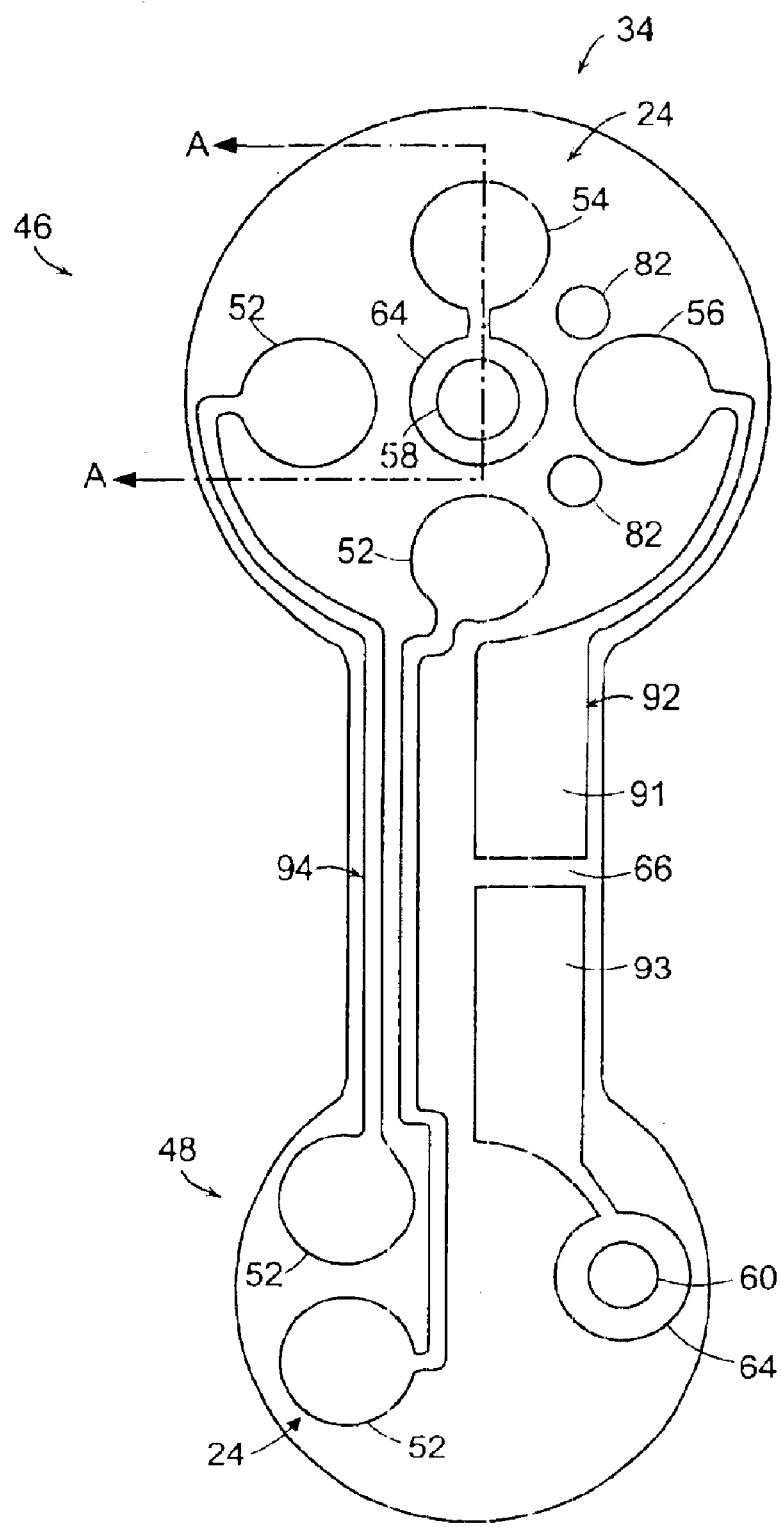
FIG. 2 shows a flex circuit for a hearing aid.
Figure 3:
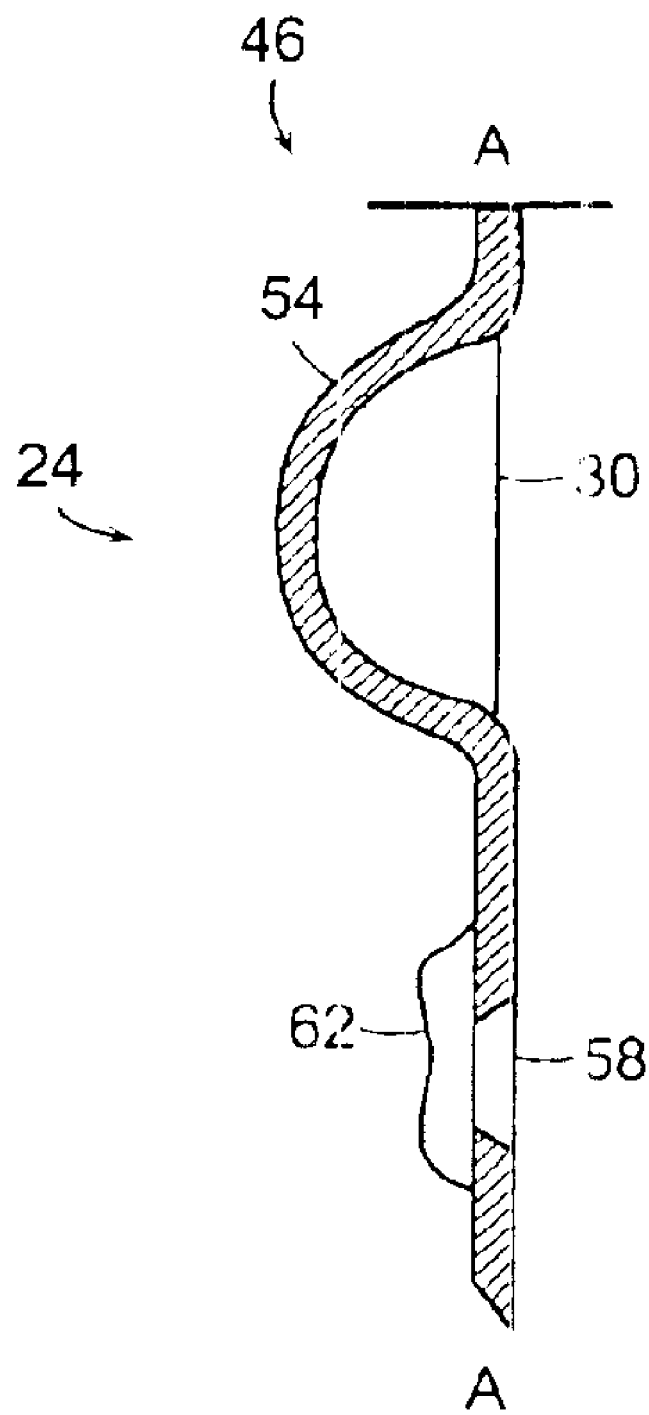
FIG. 3 illustrates a side view of a microphone mating portion of the flex circuit of FIG. 2.

FIGS. 2 and 3 illustrate the components of the flex circuit 34 which include a microphone mating portion 46, a receiver mating portion 48, and electrical connectors 24. The flex circuit 34 acts as the wiring for the hearing aid 10 and includes conducting paths 92, 94 wrapped around the battery. The flex circuit 34 can also include apertures or holes 82 to allow air to travel to the battery 30 and can have a thickness of 0.004 inches. The conducting paths can include three separate paths including an anode lead 92 and two audio signal or receiver leads 94. The anode lead 92 conducts power through the hearing aid 10 while the audio signal leads 94 conduct audio signals from the microphone 20 and microphone circuit board 22 to the receiver 36. The anode lead 92 on the kapton 34 can be gold plated and have a relatively large surface area. The two receiver leads 94 on the kapton 34 each have a relatively small surface area compared to the anode lead 92. The receiver leads 94 can be insulated from the anode lead 92 or located on the kapton 34 on a side opposite to that of the anode lead 92.

The microphone mating portion 46 abuts the microphone 20 of the first section 12. The receiver mating portion 48 abuts a receiver 36 in the third section 16 of the hearing aid 10. The electrical connectors 24 include receiver connectors 52, a cathode connector 54 and an anode connector 56. The electrical connectors 24 in the flex circuit or kapton tape 34 at each contact point can be compliant to provide spring loading and strain relief of the. For example, the electrical connectors 24 can be formed from compliant material or in a compliant shape, such as in a bubble shape, to provide spring loading and strain relief.

The receiver connectors 52 electrically attach the receiver 36 to the microphone circuit board 22. The anode connector 56 and the cathode connector 54 are each connected to an anode opening or hole 60 and a cathode opening or hole 58, respectively. The anode hole 60 and cathode hole 58 attach to the respective anode and cathode of the battery 30. Conductive paint 62 can be deposited in each hole 60, 58 and onto the conductor 64 surrounding the hole 60, 58 after flex circuit 34 is placed on the battery 30. FIG. 3 shows a cross-sectional view of the microphone mating portion 46 along the A—A axis. The conductive paint 62 connects the cathode connector 54 to the battery 30 through the cathode hole 58.

The assembly of the second section 14 consists of applying the flex circuit 34 to the battery 30 and placing the battery 30 into the shell 28. The flex circuit 34, as placed around the battery 30, establishes the proper alignment of the battery 30 with respect to both the circuit board 22 of the first section 12 and a receiver 36 of the third section 16. The battery 30 can be supplied with the flex circuit 34 pre-applied as a subassembly. The use of the flex circuit 34 allows assembly of the hearing aid 10 without soldering or welding of connecting cables during the assembly.

The anode lead 92 includes a break 66 so as to provide a discontinuity between the anode connector 56 and the anode hole 60 attached to the battery 30. The break 66 separates the anode lead 56 into a first portion 91 and second portion 93.

When such a discontinuity exists between the anode connector 56 and the battery 30, the hearing aid 10 does not draw power from the battery 30. Placement of a conductor material across the break or opening 66 bridges the discontinuity and allows power to flow through the hearing aid 10.

An alternate connection method between the flex circuit 34, the microphone circuit board 22 and the receiver 36 is to form the terminals on the circuit board 22 or receiver 36 from a compliant material or into a compliant structure. For example, if the terminals or leads from the receiver 36 are coiled into a spring-like structure, the receiver 36 can flex or be displaced during use of the hearing aid 10 without straining the contacts or leads. Spring type leads also transmit less feedback to the microphone 28. In another connection method, conductive paint can be placed or printed on the contacts or leads of the microphone circuit board 22 or receiver 36 before assembly to create a strong electric connection with the flex circuit 34.

The third section 16 of the hearing aid 10, shown in FIG. 1, includes a receiver 36 and tip 42. The tip 42 includes a mushroom shaped portion 44 and a shank or sound port 40 attached to the mushroom shaped portion 44. The tip 42 can also include a body 38 connected to the sound port 40. During the manufacturing process, the tip 42 can be formed entirely of silicone rubber. The tip 42 can also be cast in a mold using various durometer rubbers. By selecting the appropriate durometers for the tip 42 and the correct inner diameter (ID) and outer diameter (OD) ratio of the shank 40, a spring is not needed within the shank 40 to allow for flexibility of the tip 42. For example, the mushroom tip 44 can be a very soft 10 durometer, the sound port 40 can be a more stable 40 durometer, and the body 38, which normally would be a part of the hard shell, a more stable 60 durometer. The ratio of the OD of the shank 40 with respect to the ID of the shank 40 is approximately 2:1. The use of different durometer materials in the tip 42, along with an appropriate OD to ID ratio, provides flexibility in the tip 42.

The construction of the tip 42 can be performed on a casting line. When the cast part emerges from a curing oven, a receiver cavity core is withdrawn from the casting mold and the receiver 36 inserted into a cavity or nest 86 in the tip 42. At the next station on the casting line, the second section 14 is inserted into the casting mold. The following station on the casting line provides the injection of a potting material 32 on top of the receiver 36 to seal it acoustically. Encapsulating the receiver 36 within the potting material 32 reduces, and can prevent, acoustic feedback within the hearing aid 10. The potting material can include an elastomeric material, for example. The receiver 36 includes connections 90 that attach to the receiver mating portion 48 of the flex circuit 34. During the potting process, the connections are not covered or submerged in by the potting material 32, so as to provide an electrical connection between the connection 90 and the electrical connectors 24 on the flex circuit 34.

Figure 4:
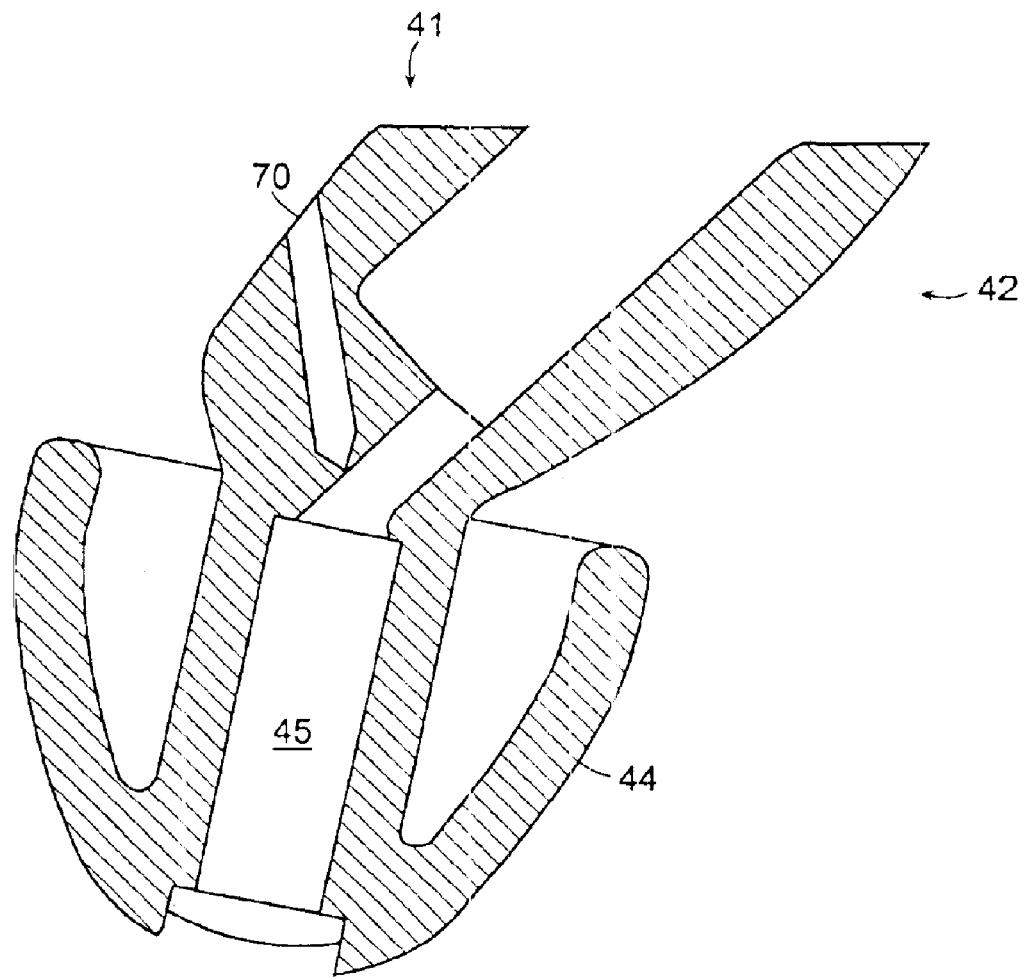
FIG. 4 illustrates a tip having a wax removal channel.

One feature of the tip 42, shown in FIG. 4, is a blind wax removal channel 70 molded into the tip 42. This channel 70 is normally closed except when a thin rod or cleaning rod is forced through the channel 70 from the receiver end 41 and through the tip 42 to remove any wax deposited within the tip 44 or bore 45. When the rod is removed, the channel 70 closes or collapses upon itself to prevent feedback within the hearing aid 10. The tip 42 can be flexible such that the tip 42 can align itself with the cleaning rod when the rod is pushed through the wax removal channel.

Figure 5:
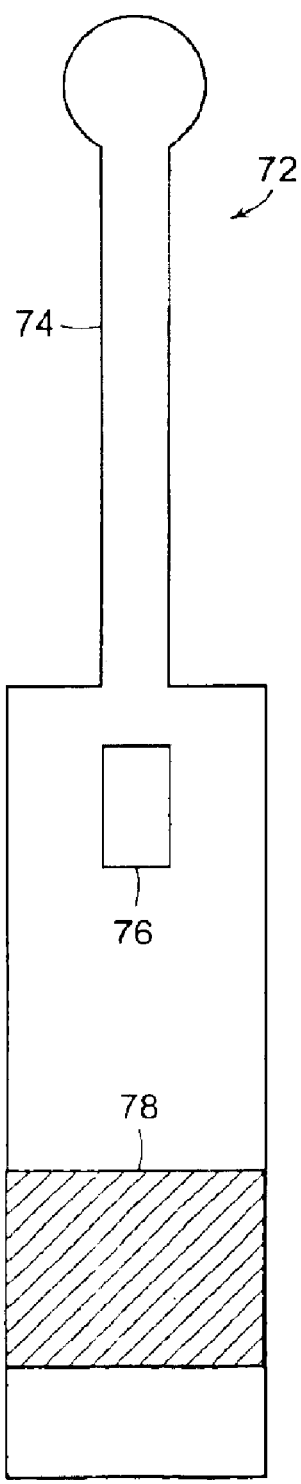
FIG. 5 shows a front view of an actuator switch for a hearing aid.
Figure 6A:
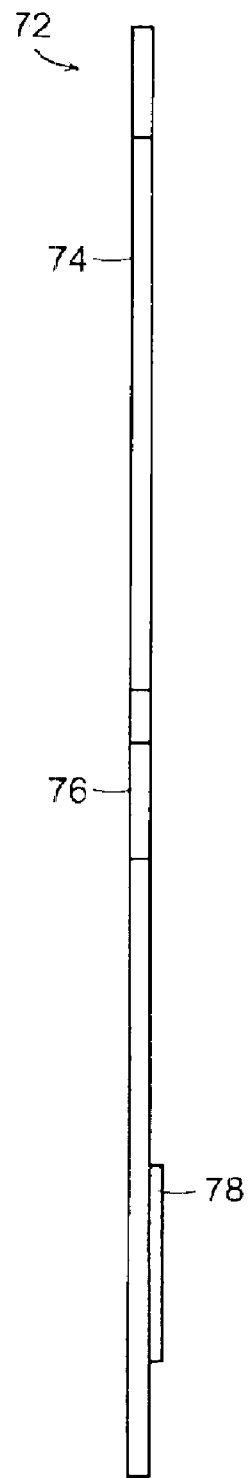
FIG. 6A shows a side view of an actuator switch for a hearing aid.

FIGS. 5 and 6A illustrate a front and side view, respectively, of a switch actuator 72 for the hearing aid 10. The switch actuator 72 includes a shaft portion 74, a latching hole 76, and a conductive surface 78. The switch actuator 72 can be manufactured from a flat, die-blanked, flexible, conductive plate. The switch actuator 72 can also be either metallic or plastic with a conductive coating 78. The switch 72 provides a bridging connection at the anode lead break 66 when the hearing aid 10 is placed in an ON mode of operation.

Figure 6B:
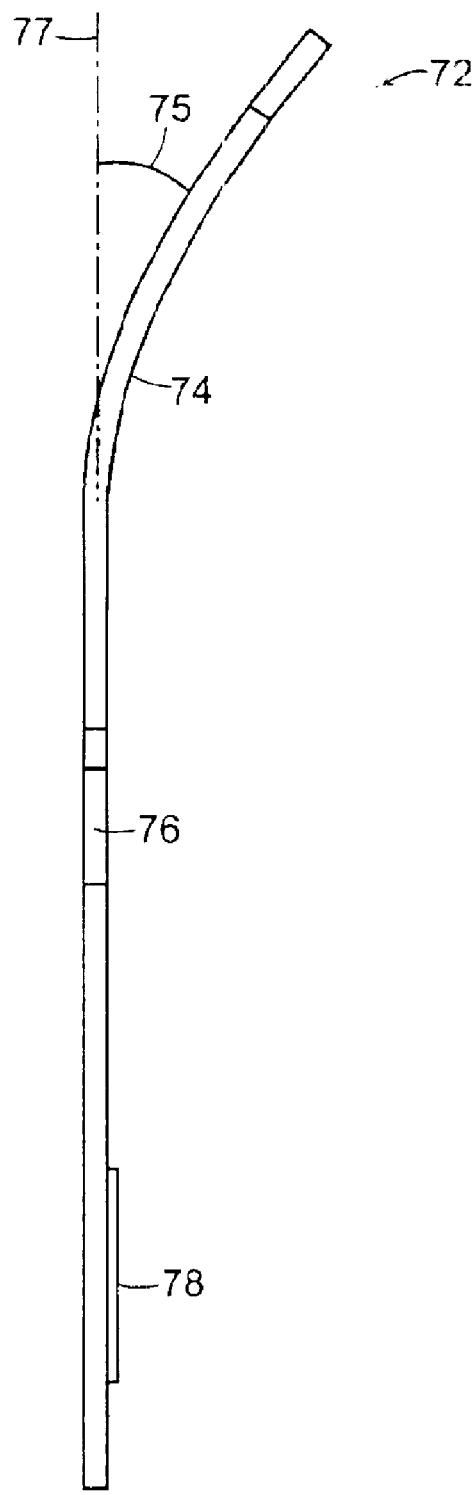
FIG. 6B illustrates an alternate embodiment of the actuator switch shown in FIG. 6A.

FIG. 6B illustrates an alternate embodiment of the switch actuator 72. The shaft portion 74 of the actuator 72 forms an angle 75 with respect to a long axis 77 of the actuator 72. Preferably, the shaft 74 is curved to create the angle 75. The curve in the shaft 74 provides an increased amount accessability to the actuator 72 by a user, as compared to a non-curved actuator 72.

Figure 7:
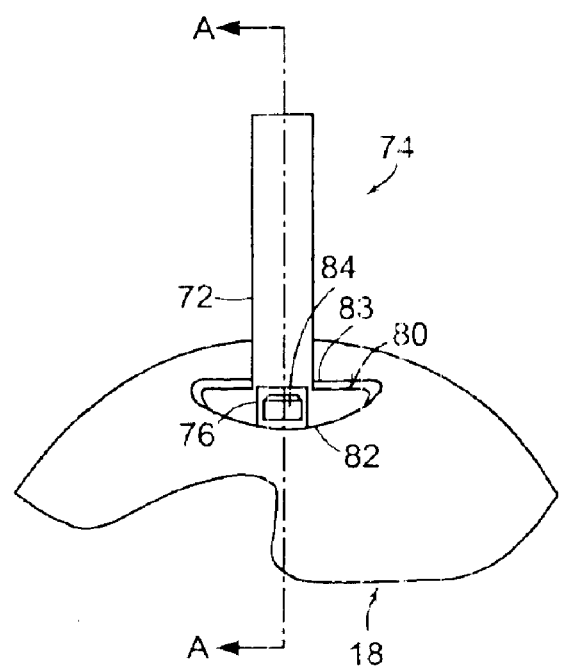
FIGS. 7 and 8 illustrate a slot in the hearing aid for insertion of an actuator switch.
Figure 8:
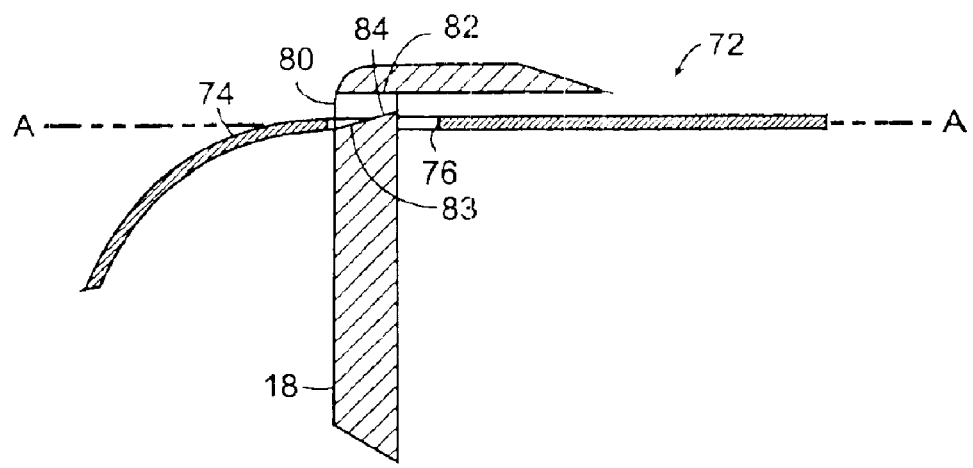

The cup or housing 18 of the hearing aid 10 includes a slot 80 to accept the switch 72, as shown in FIGS. 7 and 8. FIGS. 7 and 8 show a first edge 82 of the slot 80 as curved and a second edge 83 as containing a latching projection 84 such as a wedge, that protrudes into the latching hole or aperture 76 in the switch actuator 72. The latching projection 84 prevents the actuator 72 from being removed from the slot 80 after being inserted into the hearing aid 10. The curved edge 82 allows the switch 72 to distort during assembly to clear the wedge 84 and thereby be inserted into the slot. Preferably, no additional parts are required to be soldered to the microphone circuit board 22 to attach the actuator 72 within the hearing aid 10.

Providing power to the hearing aid involves the switch actuator 72 shown in FIG. 5 and the flex circuit or kapton tape 34 wrapped around the battery 30, shown in FIG. 2. When the battery 30 is first inserted into the second section 14 of the hearing aid 10, shown in FIG. 9, the kapton 34 abuts the inner wall 35 of the housing 18 at an interface 37, caused by an interference fit. The switch actuator 72 is then inserted into the slot 80 of the hearing aid 10 with the conductive surface 78 of the actuator 72 facing and contacting the kapton 34. The actuator 72 is constrained within the hearing aid 10 by the slot 80 and the housing 18. When inserted, the actuator 72 separates the kapton 34 from the inner wall 35. After insertion, the actuator 72 exerts a force in a first direction 96 against the flex circuit 34 while the flex circuit 34 exerts a force in a second direction 98 against the actuator 78. These forces 96, 98 help to provide a secure contact between the actuator 72 and the flex circuit 34. The contact is preferably a non-soldered contact. During the final assembly, the hearing aid 10 is in an OFF state until the switch actuator 72 is installed and engaged in an ON mode.

The hearing aid 10 is turned to an ON mode of operation when the actuator 72 is positioned so that the conductive surface 78 on the actuator 72 bridges the break 66 in the anode lead 92. Preferably, this positioning involves moving the actuator 72 into the hearing aid 10. The conductive surface 78 of the actuator 72 has dimensions such that the conductive surface 78 contacts both the first 91 and second 93 portions of the anode lead 92. In this position, the actuator 72 bridges the gap 66 between the first 91 and second 93 portions of the anode lead 92 and closes a circuit between the anode lead 92 and the battery 30, thereby providing power to the microphone 20, microphone circuit board 22 and receiver 36 in the hearing aid 10. When the actuator 72 is moved out or away from the hearing aid 10, the actuator 72 engages an OFF mode. When placing the hearing aid 10 in an OFF mode, the latching opening 76 of the actuator 72 engages the latching projection 84 of the housing 18 such that further motion of the actuator 72 away from the hearing aid 10 is prevented. In the OFF mode, the conductive surface 78 of the actuator 72 does not bridge the gap 66 in the anode lead 92 and therefore no power is transmitted from the battery 30 to the microphone 20, microphone circuit board 22 or receiver 36.

FIGS. 10 through 14 illustrate the assembly steps for a hearing aid 10. At the time of assembly, a first section including a microphone 20 and cup 18 subassembly, a battery 30 having a flex circuit 34 applied thereon, a second section shell 28, a third section 16, a receiver 36 and a switch actuator 72 are provided. Preferably, the microphone 20 and cup 18 are provided as a preassembled subassembly and the battery 30 includes the flex circuit 34 pre-applied. When assembling the aforementioned components into a hearing aid 10, a tip casting assembly line with additional pick and place stations for the receiver 36, second section shell 28, battery 30, microphone 20, and switch actuator 72 can be used. The entire final assembly can be based upon the tip casting system.

Figure 9:
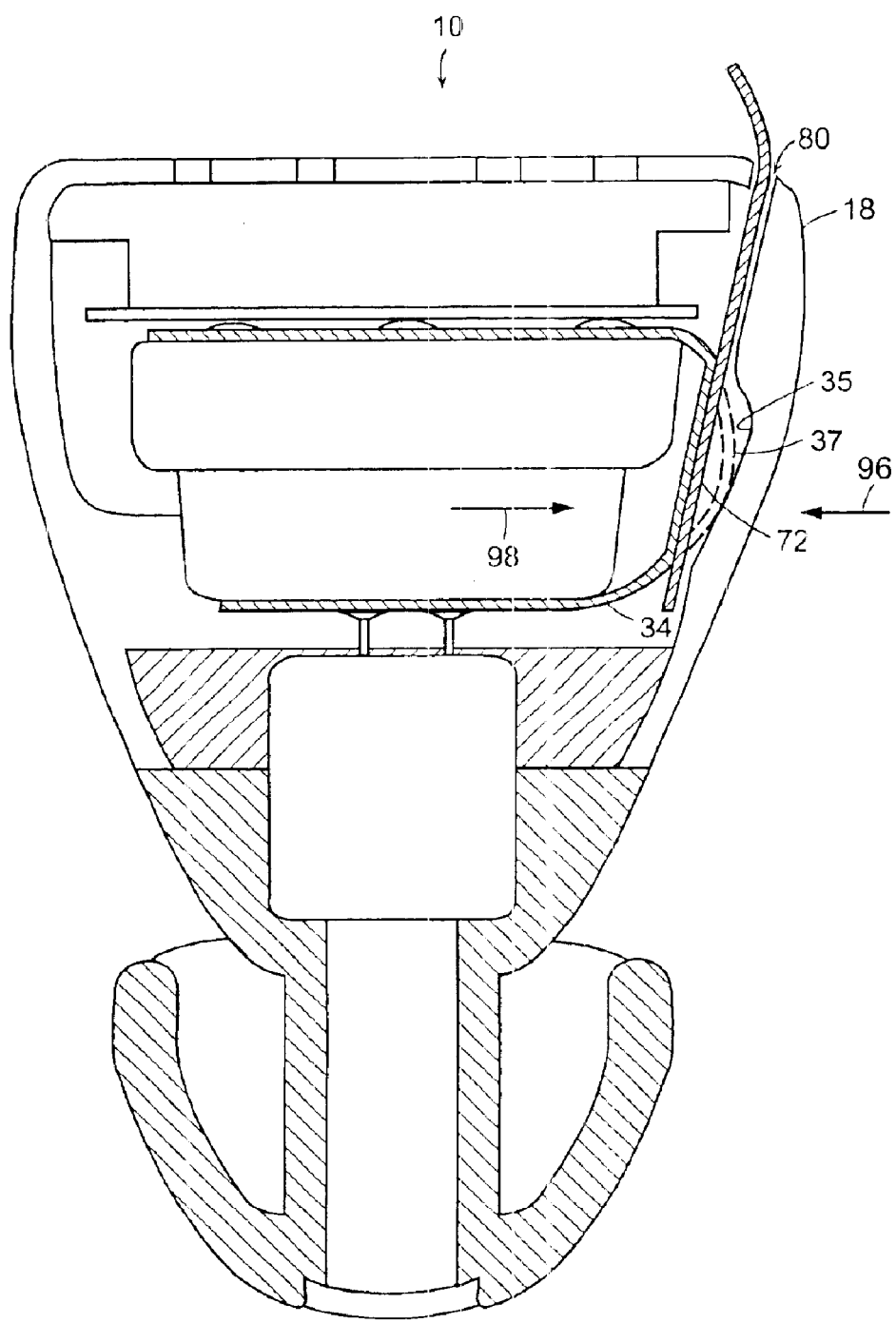
FIG. 9 illustrates the placement of the actuator switch in a hearing aid.
Figure 10:
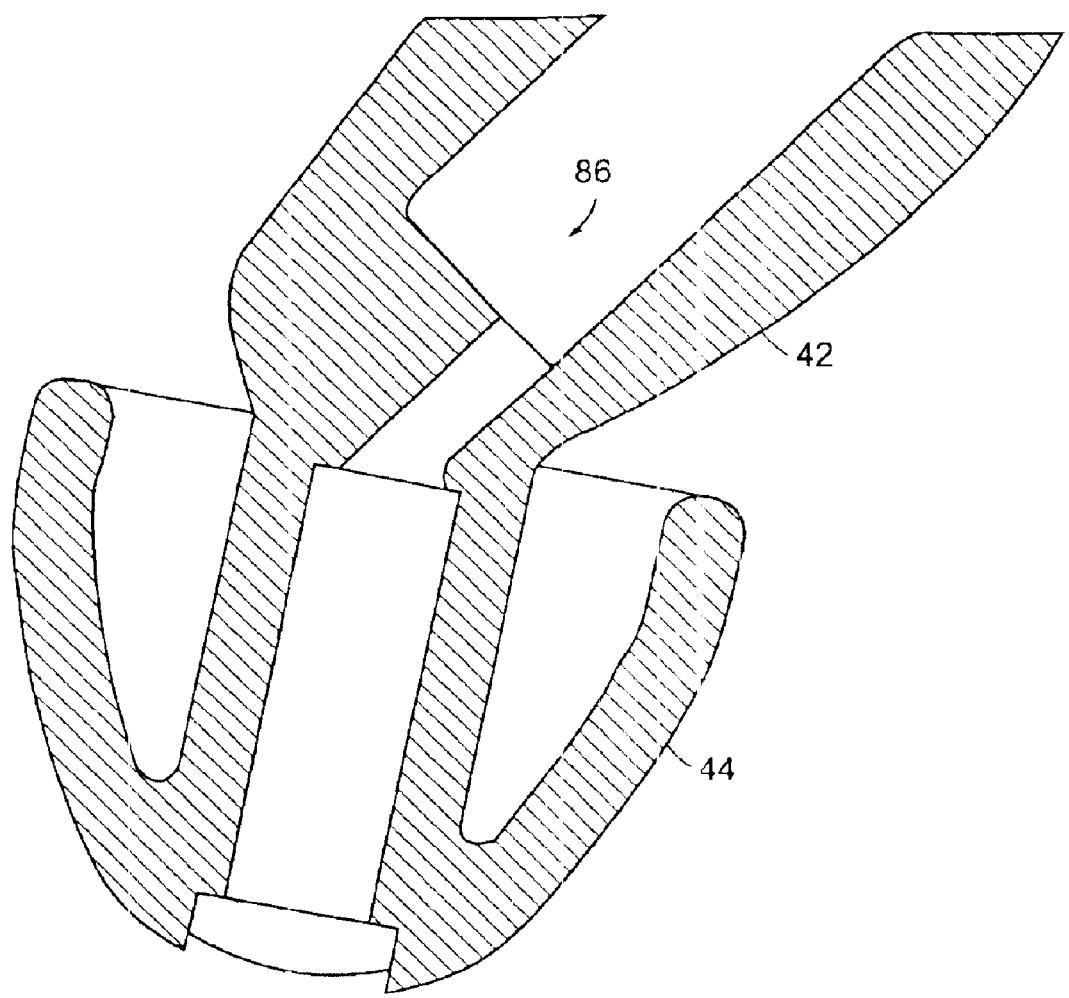
FIGS. 10 through 14 show assembly steps for forming a hearing aid.
Figure 11:
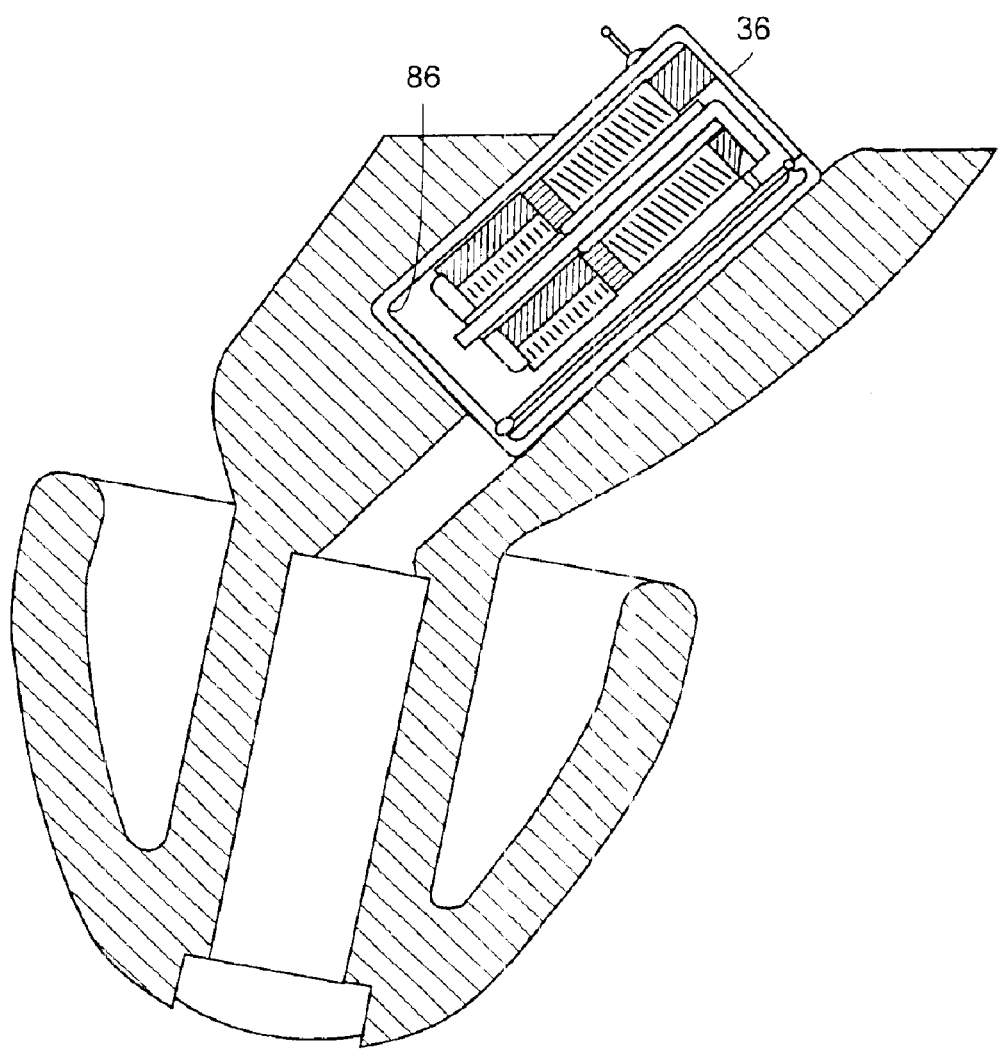
Figure 12:
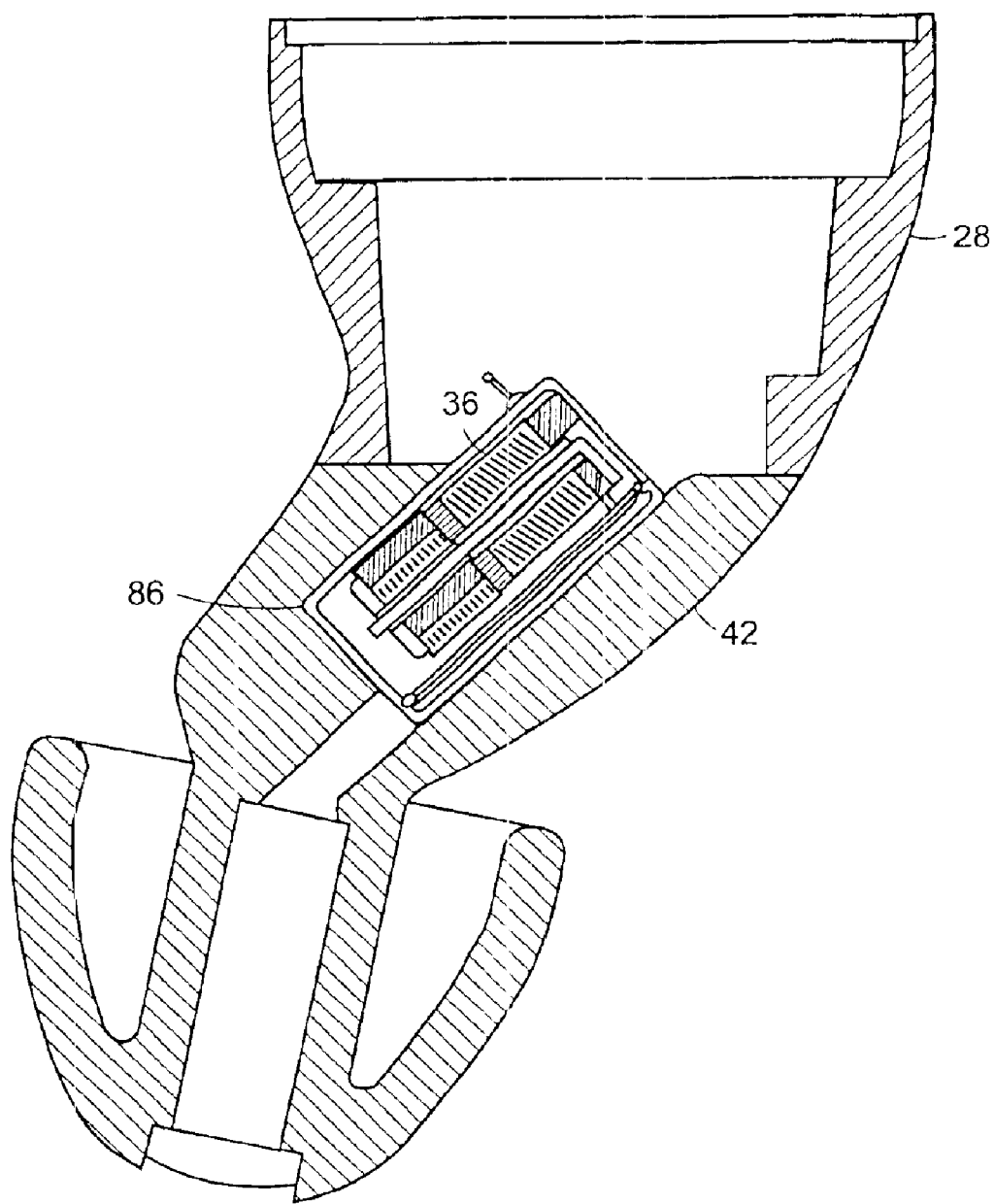
Figure 13:
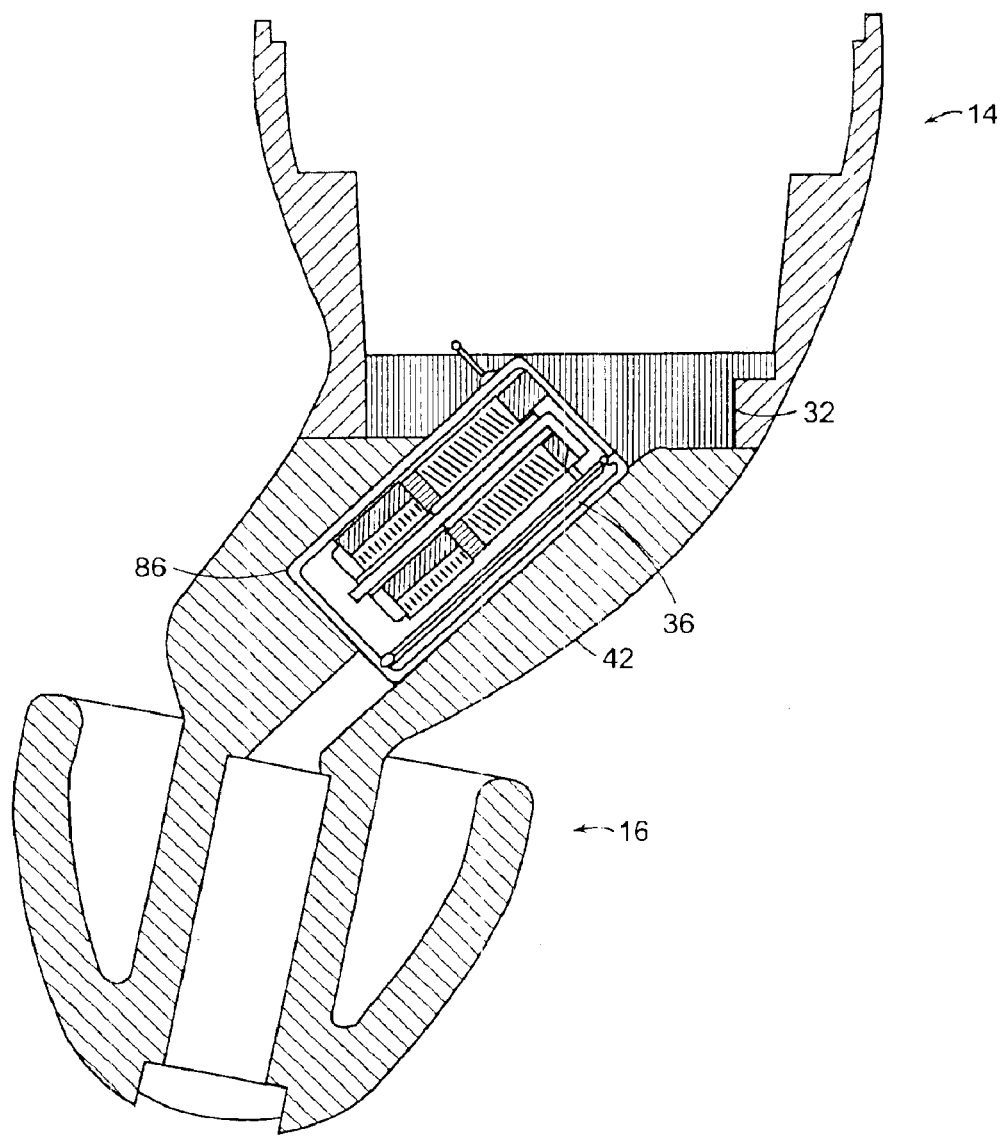
Figure 14:
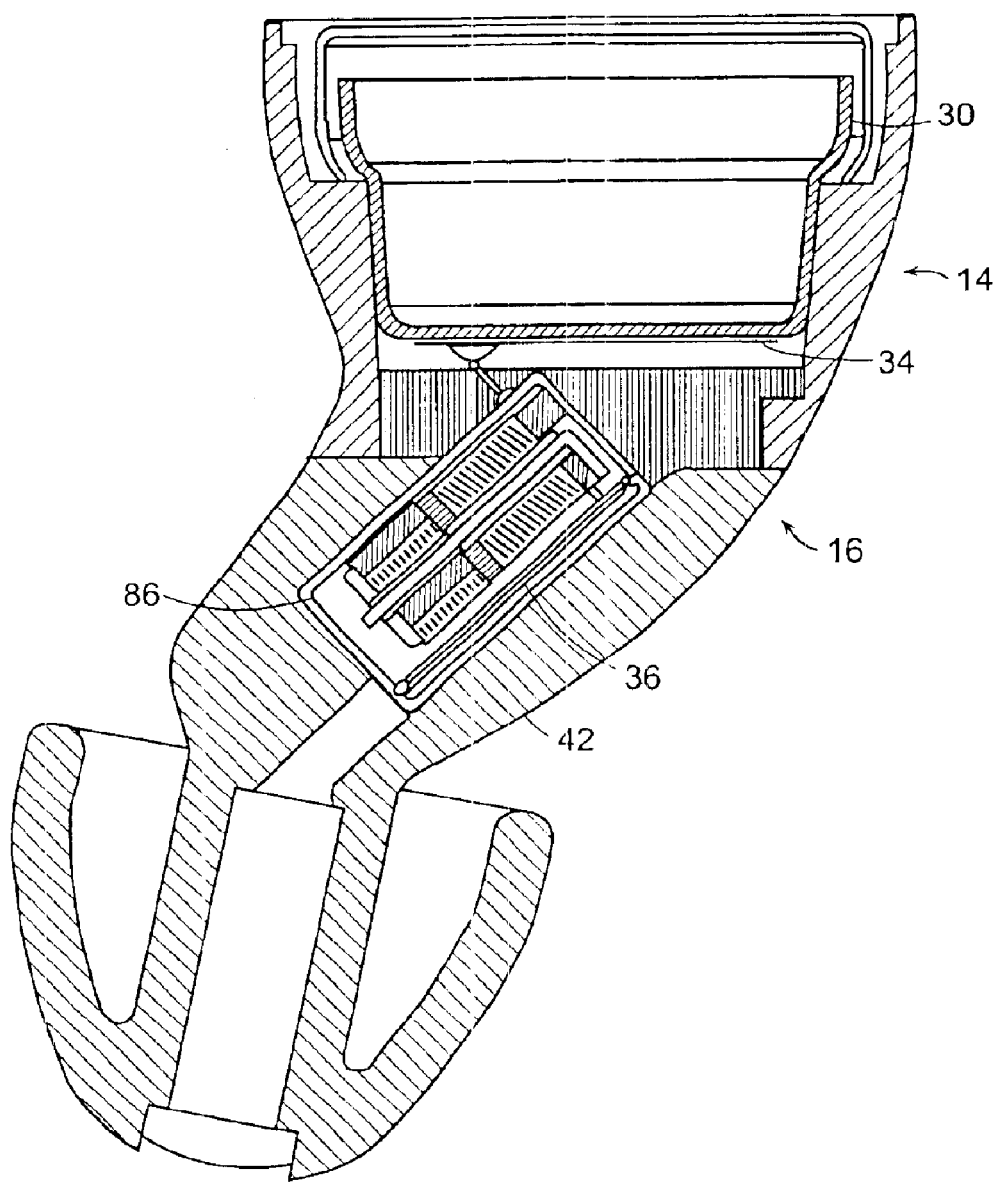

To assemble the hearing aid 10, the third section, which includes a tip 42 having a nest or receptacle 86 for a receiver 36, is cast and cured, as shown in FIG. 10. A receiver 36 is then inserted into the receptacle 86 in the tip 42 as shown in FIG. 11. FIG. 12 illustrates the following step of inserting the second section housing 28 into the casting mold of the tip 42, thereby attaching the two portions 28 and 42. Potting material 32 is added to seal the receiver 36 and bond the second section 14 to the third section 16, shown in FIG. 13. The potting material 34 can have aggressive adhesion characteristics to seal the receiver 36 and to bond the second section 14 and the tip 42. The battery 30 and flex circuit 34 assembly is then inserted into the second section housing 28 of the hearing aid 10, as shown in FIG. 14. The receiver contacts 52 on the flex circuit 34 align with and contact the receiver connections 90 on the receiver 36. The microphone assembly, which includes a microphone 20 and an microphone circuit board 22 mounted within a housing or cup 18, is connected to the second section 14 with a securing mechanism 26, shown in FIG. 1. The securing mechanism 26 is a mechanical attachment, such as a snap fit, that attaches the microphone 20, circuit board 22 and cup 18 to the second section housing 28 without solvent sealing. The switch actuator 72 then slides into the first section 12 to complete the assembly, as shown in FIG. 9. The conductive surface 78 of the actuator 72 contacts the anode lead 92 of the flex circuit 34. The actuator 72 includes a latching aperture 76 that engages a latching projection 84 in the hearing aid 10, thereby preventing removal of the actuator 72 from the hearing aid 10. The use of this manufacturing method can reduce the amount of time needed to form a hearing aid.

While this invention has been particularly shown and described with references to preferred embodiments thereof, it will be understood by those skilled in the art that various changes in form and details may be made therein without departing from the scope of the invention encompassed by the appended claims.

What is claimed is:

1. A hearing aid comprising:
   a first section, the first section containing a microphone and electronics;
   a second section attached to the first section, the second section containing a non-rechargeable battery permanently affixed within the hearing aid; and
   a third section attached to the second section, the third section having a compliant tip and a receiver contained within a receptacle in the tip, and;
   a circuit electrically connecting the microphone, electronics, receiver and battery and wherein the compliant tip comprises a mushroom shaped portion and a sound port is attached to the mushroom shaped portion and the compliant tip includes a first durometer material, a second durometer material and a third durometer material, the first durometer material being more compliant than the second durometer material and the third durometer material being less compliant than the second durometer material.

2. The hearing aid of claim 1 wherein the circuit comprises a receiver mating portion and a microphone mating portion, the receiver mating portion abutting the receiver and the microphone mating portion abutting the microphone.

3. The hearing aid of claim 1 wherein the circuit comprises compliant electrical connectors for connecting the microphone, electronics, receiver and battery, the compliant electric connectors providing strain relief for the circuit.

4. The hearing aid of claim 1 wherein the circuit includes a microphone mating portion that abuts the microphone and forms an electric connection between the circuit and the microphone.

5. The hearing aid of claim 1 wherein the circuit includes a receiver mating portion that abuts the receiver and forms an electric connection between the circuit and the receiver.

6. The hearing aid of claim 1 wherein the circuit includes a plurality of conductive paths.

7. The hearing aid of claim 6 wherein the conductive paths include of at least one receiver lead.

8. The hearing aid of claim 6 wherein the conductive paths include at least one anode lead.

9. The hearing aid of claim 8 wherein the anode lead includes a discontinuity which prevents the hearing aid from drawing power from the battery, unless bridged.

10. The hearing aid of claim 9 further comprising an actuator mounted to the hearing aid, the actuator having a conductive surface contacting the anode such that the conductive surface bridges the discontinuity in the anode to engage the hearing aid in an ON mode of operation.

11. The hearing aid of claim 1 wherein the circuit comprises at least one aperture to allow air to travel to the battery.

12. The hearing aid of claim 1 further comprising a mechanical securing mechanism between the first section and the second section.

13. The hearing aid of claim 1 wherein the first durometer material forms the mushroom shaped portion of the tip.

14. The hearing aid of claim 1 wherein the second durometer material forms the sound port of the tip.

15. The hearing aid of claim 1 wherein the third durometer material forms a body portion of the tip.

16. A hearing aid comprising:
   a first section, the first section having a first housing containing a microphone and electronics;
   a second section attached to the first section, the second section having a second housing containing a non-rechargeable battery permanently mounted; and
   a third compliant section attached to the second section, the third section having a tip portion, a body portion and a sound port portion and a receiver contained within a receptacle formed in the body portion; and
   a circuit electrically connecting the microphone, electronics, receiver and battery.

17. The hearing aid of claim 16 wherein the second section comprises a potting material surrounding the receiver such that the potting material and the receptacle of the tip encapsulate the receiver to attenuate acoustic feedback.

18. The hearing aid of claim 16 wherein the tip portion includes a channel for removal of wax from a bore in the tip.

19. The hearing aid of claim 16 wherein the tip portion is mushroom shaped and a sound port is attached to the tip portion.

20. The hearing aid of claim 19 wherein the tip portion comprises a first durometer material and a second durometer material, the first durometer material being more compliant than the second durometer material.

21. The hearing aid of claim 20 wherein the first durometer material forms the mushroom of the tip portion.

22. The hearing aid of claim 20 wherein the second durometer material forms the sound port portion.

23. The hearing aid of claim 16 wherein the circuit comprises a receiver mating portion and a microphone mating portion, the receiver mating portion abutting the receiver and the microphone mating portion abutting the microphone.

24. The hearing aid of claim 16 wherein the circuit comprises compliant electrical connectors for connecting the microphone, electronics, receiver and battery, the compliant electric connectors providing strain relief for the circuit.

25. The hearing aid of claim 16 wherein the circuit includes a microphone mating portion that abuts the microphone and forms an electric connection between the circuit and the microphone.

26. The hearing aid of claim 16 wherein the circuit includes a receiver mating portion that abuts the receiver and forms an electric connection between the circuit and the receiver.

27. The hearing aid of claim 16 wherein the circuit includes a plurality of conductive paths.

28. The hearing aid of claim 27 wherein the conductive paths include of at least one receiver lead.

29. The hearing aid of claim 27 wherein the conductive paths include at least one anode lead.

30. The hearing aid of claim 29 wherein the anode lead includes a discontinuity which prevents the hearing aid from drawing power from the battery, unless bridged.

31. The hearing aid of claim 30 further comprising an actuator mounted to the hearing aid, the actuator having a conductive surface contacting the anode such that the conductive surface bridges the discontinuity in the anode to engage the hearing aid in an ON mode of operation.

32. The hearing aid of claim 16 wherein the circuit comprises at least one aperture to allow air to travel to the battery.

33. The hearing aid of claim 16 further comprising a mechanical securing mechanism between the first section and the second section.

34. The hearing aid of claim 16 wherein the second section includes a potting material covering the receiver such that the potting material and the receptacle of the body portion encapsulate the receiver to attenuate acoustic feedback.

35. The hearing aid of claim 16 wherein the sound port portion includes a channel for removal of wax from a bore in the sound port portion.

36. The hearing aid of claim 16 wherein the tip portion is mushroom shaped and the sound port portion is integral with the tip portion.

37. The hearing aid of claim 36 wherein the tip portion comprises a first durometer material and the sound port portion comprises a second durometer material, the first durometer material being more compliant than the second durometer material.

38. The hearing aid of claim 37 wherein the first durometer material forms the mushroom shape of the tip.

39. The hearing aid of claim 36 wherein the tip further comprises a body portion, and the sound port is integral with the body portion.

40. The hearing aid of claim 39 wherein the first durometer material forms the mushroom of the tip.

41. The hearing aid of claim 39 wherein the second durometer material forms the sound port portion.

42. The hearing aid of claim 39 wherein the third durometer material forms the body portion.

* * * * *